United States Patent
Cao et al.

(10) Patent No.: US 10,962,497 B2
(45) Date of Patent: Mar. 30, 2021

(54) SENSORS BASED ON NEGATIVE CAPACITANCE FIELD EFFECT TRANSISTORS

(71) Applicant: INTERNATIONAL BUSINESS MACHINES CORPORATION, Armonk, NY (US)

(72) Inventors: Qing Cao, Westchester, NY (US); Jianshi Tang, Elmsford, NY (US); Ning Li, White Plains, NY (US); Ying He, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 15/846,857

(22) Filed: Dec. 19, 2017

(65) Prior Publication Data
US 2019/0187087 A1 Jun. 20, 2019

(51) Int. Cl.
```
G01N 27/414   (2006.01)
G01N 27/22    (2006.01)
G01N 31/22    (2006.01)
G11C 11/22    (2006.01)
```

(52) U.S. Cl.
CPC ......... *G01N 27/227* (2013.01); *G01N 27/414* (2013.01); *G01N 27/4145* (2013.01); *G01N 31/221* (2013.01); *G11C 11/221* (2013.01); *G11C 11/2273* (2013.01)

(58) Field of Classification Search
None
See application file for complete search history.

(56) References Cited

U.S. PATENT DOCUMENTS

| | | | |
|---|---|---|---|
| 4,743,954 A * | 5/1988 | Brown | G01N 27/4148 257/253 |
| 8,362,604 B2 | 1/2013 | Ionescu | |
| 8,653,510 B2 | 2/2014 | Hodges, Jr. et al. | |
| 8,785,995 B2 | 7/2014 | Dubourdieu et al. | |
| 9,484,924 B2 | 11/2016 | Shin et al. | |
| 9,515,157 B2 | 12/2016 | Woerdenweber | |
| 9,722,093 B1 | 8/2017 | King et al. | |
| 2005/0218464 A1* | 10/2005 | Holm-Kennedy | G01N 27/4145 257/414 |

(Continued)

OTHER PUBLICATIONS

Kai-Shin Li et al., Sub-60mV-Swing Negative-Capacitance FinFET without Hysteresis, 2015 IEEE International Electron Devices Meeting (IEDM), Washington, DC, Dec. 2015, pp. 22.6.1-22.6.4.

(Continued)

*Primary Examiner* — Paul S Hyun
(74) *Attorney, Agent, or Firm* — Tutunjian & Bitetto, P.C.; Anthony Curro

(57) ABSTRACT

Chemical sensors and methods of forming and making the same include a semiconductor substrate having an input terminal and an output terminal. A negative capacitance structure is positioned on the semiconductor substrate and is configured to control a current passing from the input terminal to the output terminal. A functionalized electrode is in electrical contact with the negative capacitance structure and is configured to change surface potential in the presence of an analyte, such that a phase change in the negative capacitance structure is triggered when the surface potential exceeds a threshold.

15 Claims, 6 Drawing Sheets

(56) References Cited

U.S. PATENT DOCUMENTS

| | | | |
|---|---|---|---|
| 2006/0038242 A1 | 2/2006 | Hsu et al. | |
| 2006/0102935 A1* | 5/2006 | Yitzchaik | C07K 17/14 |
| | | | 257/253 |
| 2007/0003695 A1* | 1/2007 | Tregub | G11C 11/22 |
| | | | 427/240 |
| 2009/0152607 A1* | 6/2009 | Tanaka | G11C 11/22 |
| | | | 257/295 |
| 2010/0096679 A1* | 4/2010 | Park | G11C 11/22 |
| | | | 257/295 |
| 2011/0147723 A1* | 6/2011 | Hodges, Jr. | H01L 51/0529 |
| | | | 257/40 |
| 2016/0118490 A1* | 4/2016 | Padmanabhan | H01L 27/0629 |
| | | | 257/195 |
| 2016/0169834 A1 | 6/2016 | Ning et al. | |
| 2017/0365719 A1 | 12/2017 | Chen et al. | |
| 2018/0166448 A1 | 6/2018 | Cheng et al. | |

OTHER PUBLICATIONS

Sayeef Salahuddin et al., Use of Negative Capacitance to Provide Voltage Amplification for Low Power Nanoscale Devices, School of Electrical and Computer Engineering and NSF Center for Computational Nanotechnology (NCN), Purdue UniVersity, West Lafayette, Indiana 47907, Jul. 2007.

Giovanni A. Salvatore et al., Demonstration of Subthrehold Swing Smaller Than 60mV/decade in Fe-FET with P (VDF-TrFE)/SiO2 Gate Stack, 2008 IEEE International Electron Devices Meeting, San Francisco, CA, Dec. 2008, pp. 1-4.

\* cited by examiner

SENSORS BASED ON NEGATIVE CAPACITANCE FIELD EFFECT TRANSISTORS

BACKGROUND

Technical Field

The present invention generally relates to chemical and biological sensors and, more particularly, to sensors that are triggered using field effect transistors with negative capacitance properties.

Description of the Related Art

Transistors (including field effect transistors (FETs) and bipolar junction transistors (BJTs)) can be used as sensors in chemical and biological testing scenarios. The presence of a particular chemical species being measured (referred to herein as an "analyte") causes a charge or voltage to build up on the gate or the base terminal of the transistor, thereby changing the amount of current passing through the device and providing a detection signal.

However, such sensors have limited sensitivity, limited by a transistor's sub-threshold slope. The sub-threshold slope characterizes how the device's effective resistance changes for voltages below the transistor's threshold voltage. Such devices generally exhibit exponentially increasing current as voltage increases in the sub-threshold range, and the sub-threshold slope is measured in units of millivolts per order of magnitude change in the output current. Typical transistors have a sub-threshold slope of about 60 mV/decade.

SUMMARY

A chemical sensor includes a semiconductor substrate having an input terminal and an output terminal. A negative capacitance structure is positioned on the semiconductor substrate and is configured to control a current passing from the input terminal to the output terminal. A functionalized electrode is in electrical contact with the negative capacitance structure and is configured to change surface potential in the presence of an analyte, such that a phase change in the negative capacitance structure is triggered when the surface potential exceeds a threshold.

A method for sensing the presence of an analyte includes exposing a functionalized electrode to a substance to be tested. The functionalized electrode is electrically connected to a sensor having a transistor. A negative capacitance structure controls a current that passes between an input terminal and an output terminal of the transistor. The current passing between the input terminal and the output terminal of the transistor is measured. The presence of the analyte is determined based on changes in the measured current.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide transistor-based sensors with superior sensitivity by lowering the subthreshold slope, such that smaller changes in voltage will trigger larger changes in current output. To accomplish this, ferroelectric materials exhibiting negative capacitance properties are used to fabricate transistor-based sensors. Such devices will trigger in the presence of lower concentrations of an analyte, making them more sensitive.

Figure 1:
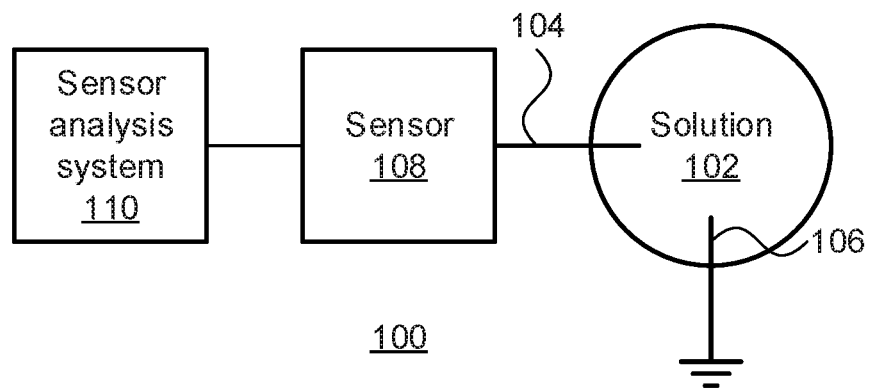
FIG. 1 is a block diagram of a chemical sensor system that uses a negative capacitance sensor in accordance with an embodiment of the present invention.

Referring now to FIG. 1, a sensor system 100 is shown. The system 100 includes a solution 102 that is being tested for the presence of an analyte. A functionalized metal electrode 104 is present in the solution 102 along with a grounded reference electrode 106. The functionalized metal electrode 104 has a treatment or composition that binds to the analyte in question, such that the analyte adsorbs to the surface of the functionalized metal electrode 104 and changes the surface potential. It should be understood that, although the present embodiments are described with respect to a liquid solution, the same principles may also be applied to sensors configured to detect gaseous analytes. A "functionalized" metal is a material that has chemicals on its surface that selectively bind with a specific analyte. The chemicals may include any appropriate substance from small molecules to large biomolecules, such as enzymes, antibodies, and aptamers. In one specific embodiment, the material of the reference electrode 106 may be made up of a silver wire immersed in a saturated silver chloride solution with a fixed potential. Thus, measuring the voltage difference between the reference electrode 106 and the functionalized metal electrode 104 can provide an absolute potential on the sensing electrode.

The functionalized metal electrode, in turn, is connected to the sensor device 108. As is discussed in greater detail below, the sensor device 108 makes use of a transistor. Although field effect transistors (FETs) are discussed throughout, it should be understood that bipolar junction transistors (BJTs) may be used instead to similar effect. A change in the surface potential of the functionalized electrode 104 causes a corresponding change in the potential at a ferroelectric element of the sensor device 108 which, in turn, triggers the transistor in the sensor device 108 and changes a current output by the sensor device 108. A sensor analysis system 110 monitors current output by the sensor 108, maintaining a record of the sensor's output to determine when that output changes, indicating the presence of an analyte.

In one specific example, where the sensor system 100 is used to detect a pH change, the functionalized metal electrode 104 may be functionalized by titanium nitride. The pH level of the solution 102 affects the surface potential at the functionalized metal electrode 104, with different pH values being associated with different potentials. Because the sub-threshold slope of the sensor device 108 is low, a small change in pH will result in a large change in output current, making such changes easy to measure.

Figure 2:
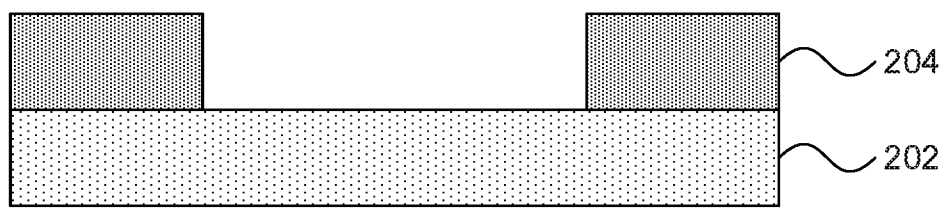
FIG. 2 is a cross-sectional diagram of a step in the fabrication of a chemical sensor system that shows the formation of source and drain regions on a substrate in accordance with an embodiment of the present invention.

Referring now to FIG. 2, a cross-sectional view of a step in the formation of a sensor device 108 is shown. Source and drain regions 204 are formed on a semiconductor substrate 202. In this particular embodiment the source and drain regions 204 are shown as being formed on top of the semiconductor substrate 202 by, e.g., epitaxial growth with in situ doping, but it should be understood that, in other embodiments, the source and drain regions may be formed within the semiconductor substrate 202 by, e.g., dopant implantation.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, zinc selenide, and various organic semiconductors. Although not depicted in the present figures, the semiconductor substrate 102 may also be a semiconductor on insulator (SOI) substrate. Alternative substrate materials may include, e.g., carbon nanotubes and molybdenum disulfide.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The source and drain regions 204 may be doped with p-type dopants or n-type dopants. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 3:
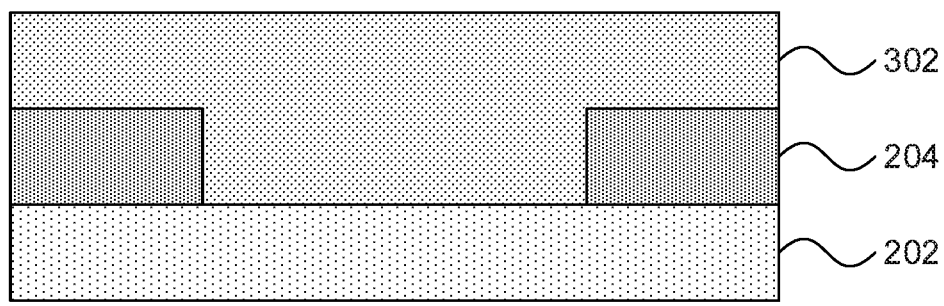
FIG. 3 is a cross-sectional diagram of a step in the fabrication of a chemical sensor system that shows the formation of a gate dielectric layer over the source and drain regions and the substrate in accordance with an embodiment of the present invention.

Referring now to FIG. 3, a cross-sectional view of a step in the formation of a sensor device 108 is shown. A gate dielectric layer 302 is deposited over the substrate 202 and the source/drain regions 204. The gate dielectric layer 302 may be formed from any appropriate dielectric material and may be deposited by any appropriate deposition process including, e.g., chemical vapor deposition (CVD), physical vapor deposition (PVD), atomic layer deposition (ALD), gas cluster ion beam (GCIB) deposition, or flowable oxide spin-on deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The dielectric material for the gate dielectric layer 302 may be any appropriate insulating material, including for example silicon dioxide, high-k dielectrics, or low-k dielectrics. A high-k dielectric as used herein refers to a material having a dielectric constant k that is higher than that of silicon dioxide (e.g., greater than about 3.9). A low-k dielectric as used herein refers to a material having a dielectric constant k that is lower than that of silicon dioxide (e.g., lower than about 3.9).

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum and aluminum. Examples of low-k dielectric materials include, but are not limited to, SiCOH, aromatic hydrocarbon polymer compositions, carbon-doped oxides, and undoped silica glass.

Figure 4:
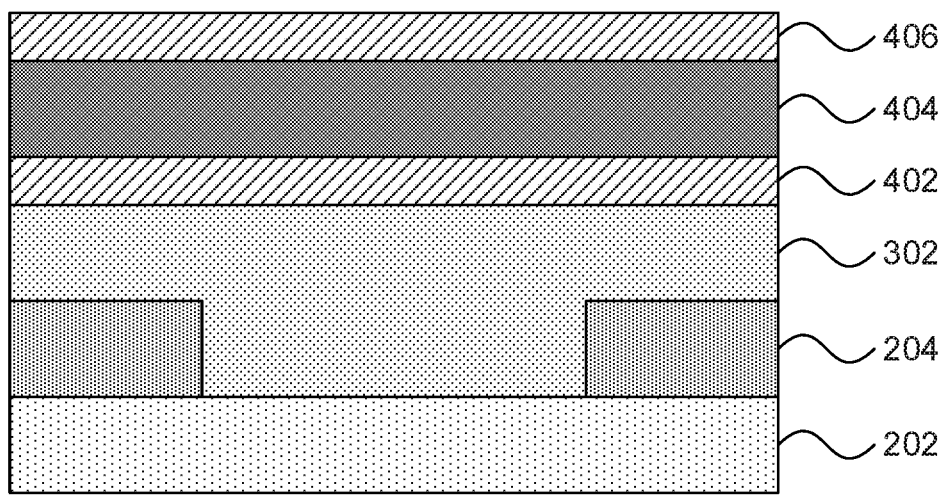
FIG. 4 is a cross-sectional diagram of a step in the fabrication of a chemical sensor system that shows the formation of a negative capacitance structure over the gate dielectric layer in accordance with an embodiment of the present invention.

Referring now to FIG. 4, a cross-sectional view of a step in the formation of a sensor device 108 is shown. A capacitor stack is formed from a first metal layer 402, a ferroelectric layer 404, and a second metal layer 406. The first and second metal layers 402 and 406 may be formed from any appropriate conductive metal or metallic substance including, without limitation, tungsten, nickel, titanium, molybdenum, tantalum, copper, platinum, silver, gold, ruthenium, iridium, rhodium, rhenium, and alloys thereof.

Ferroelectric layer 404 is formed from a ferroelectric material such as, e.g., a polyvinylidene fluoride such as, e.g., $P(VDF_{0.75}\text{-}TrFe_{0.25},\ PbZr_{0.52}Ti_{0.48}O_3)$. Ferroelectric materials have the unique property whereby the materials exhibit polarization, even in the absence of an electric field. This polarization is relatively stable and can be set and reversed by applying suitably strong electric fields. The ferroelectric layer 404 thereby provides a certain amount of hysteresis, along with sudden field changes as an applied voltage exceeds a ferroelectric phase shift threshold.

Ferroelectric materials thereby exhibit a property known as negative capacitance. Capacitance generally obeys the relationship of q=CV, where q represents the charge accumulated in the capacitor, C represents the capacitance of the capacitor, and V represents a voltage across the capacitor's terminals. Thus, for conventional capacitors with positive capacitance values, an increase in the accumulated charge corresponds to an increase in the voltage across the capacitor. In the case of a negative capacitance value, however, an increase in charge will produce a decrease in the voltage across the capacitor.

Ferroelectric materials exhibit this negative capacitance as a dynamic state in ferroelectric switching for part of a range of applied voltages. At some threshold voltage, the electric polarization of the material will reverse, causing a sudden change in the effective charge at the terminals. To use the present structures as an example, if the ferroelectric layer 404 initially has a polarization pointed upward (e.g., exhibiting a static electric dipole field with an effective negative charge at the top surface and an effective positive charge at the bottom surface), and electrons accumulate on the top surface, the voltage across the ferroelectric layer 404 will increase until the electrons exert the threshold potential on the ferroelectric material, at which point the polarization will flip. At this point the effective negative charge of the ferroelectric layer 404 will switch to be at the bottom surface and the effective positive charge of the ferroelectric layer 404 will be at the top surface. The net result is a sudden drop in the voltage across the device and in the electric field exerted upon the underlying transistor structure.

Figure 5:
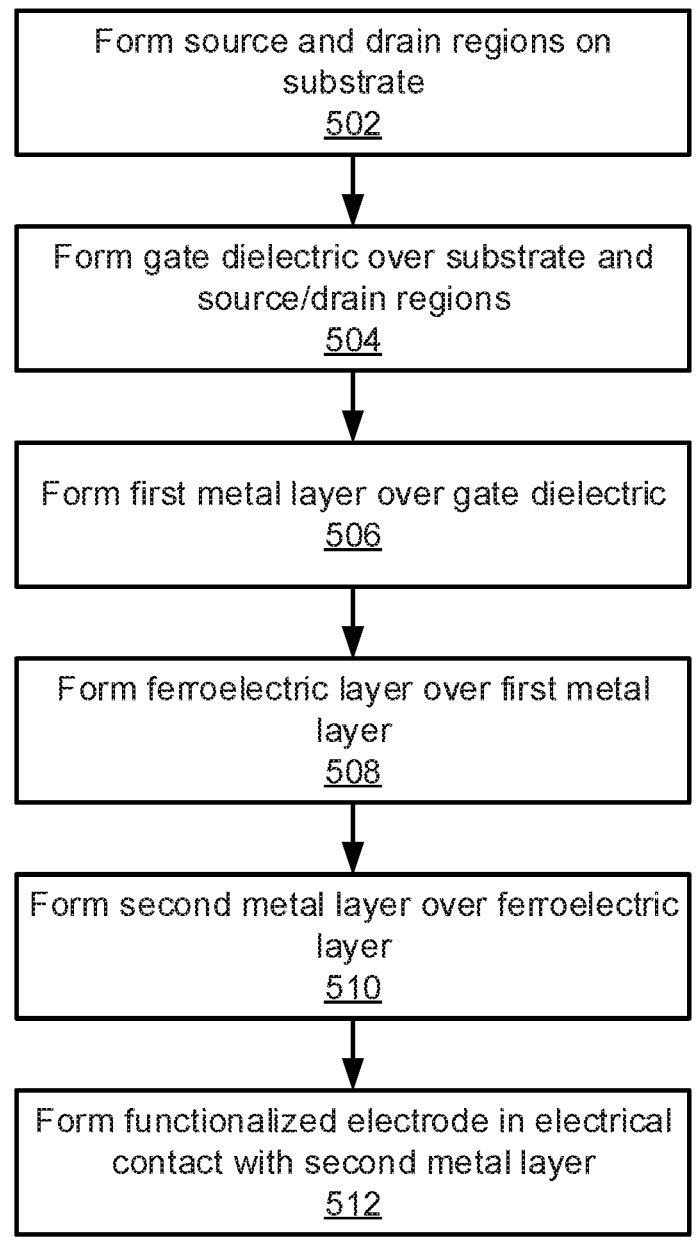
FIG. 5 is a block/flow diagram of a method of fabricating a chemical sensor that uses negative capacitance in accordance with an embodiment of the present invention.

Referring now to FIG. 5, a method of forming a sensor 108 is shown. Block 502 forms the source and drain regions 204 on the semiconductor substrate 202. As noted above, these source and drain regions 204 can be formed by any appropriate process. In some embodiments, the source and drain regions 204 may be formed by epitaxially growing such structures from the surface of the semiconductor substrate 202 and may be doped in situ during the growth process. In other embodiments, the source and drain regions may be formed by depositing a material through, e.g., CVD, PVD, ALD, or GCIB deposition and may be doped through ion implantation. In still other embodiments, the source and drain regions 204 may be formed from the semiconductor substrate 202 itself, either by etching away substrate material to create distinct structures and then doping those structures or by simply doping the semiconductor substrate's surface, creating source and drain regions 204 that are in the plane of the surface of the semiconductor substrate 202.

Block 504 forms a gate dielectric 302 over the substrate 202 and source/drain regions 204 by any appropriate process including, e.g., CVD, PVD, ALD, GCIB deposition, or spin-on flowable dielectric deposition. The formation of the gate dielectric may be followed by a polishing step to create a planar top surface by, e.g., chemical mechanical planarization (CMP). CMP is performed using, e.g., a chemical or granular slurry and mechanical force to gradually remove upper layers of the device. The CMP process may be timed to leave an appropriate thickness to the gate dielectric 302. Alternatively, the slurry may be formulated to be unable to dissolve some blocking structure, resulting in the CMP process's inability to proceed any farther than that structure.

Block 506 forms a first metal layer 402 over the gate dielectric layer 302 by, e.g., CVD, PVD, ALD, or GCIB deposition. Block 508 then forms the ferroelectric layer 404 over the first metal layer 402 using, for example, PVD or ALD. Block 510 forms the second metal layer 406 over the ferroelectric layer 404.

Block 512 then forms the functionalized electrode 104 that will react with the analyte in question. The functionalized electrode 104 may be a conventional electrode that has a surface treatment that binds with the analyte in question or may, alternatively, be formed from a material that inherently reacts with the analyte. In some embodiments, the functionalized electrode 104 may be the second metal layer 406 itself, while in other embodiments the functionalized electrode 104 may be a separate physical structure that is in electrical contact (e.g., through a wire or other conductive structure) with the second metal layer 406. The functionalized electrode 104 may be formed by, for example, a PVD of titanium nitride for a pH sensor or by immobilization of chemicals based on a chemical bond (such as gold-sulfur bonding) to the metal surface.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 6:
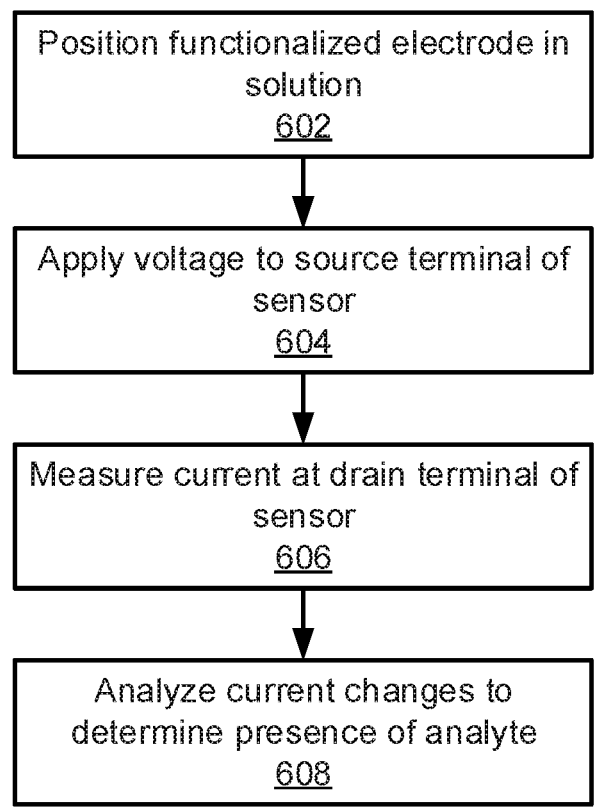
FIG. 6 is a block/flow diagram of a method of sensing the presence of an analyte in accordance with an embodiment of the present invention.

Referring now to FIG. 6, a method for detecting the presence of an analyte is shown. Block 602 positions the functionalized electrode 104 in the solution 102. Block 604 applies a voltage to the source terminal of the sensor 108 and block 606 measures the resulting current at the drain terminal of the sensor 108. In alternative embodiments using a BJT transistor structure instead of a FET, the source and drain may be replaced by the collector and emitter.

Block 608 analyzes the current output by the sensor 108. This analysis looks for changes in the current, in particular large changes indicative of the presence of sufficient analyte to cause the ferroelectric component of the sensor 108 to change its polarity. To accomplish this, block 608 maintains a running record of current values and notes when an above-threshold change occurs over a suitably short period of time.

In one example, block 608 maintains a running average of the sensor's current output and registers a measured current value that differs from the average current by at least some threshold value to indicate the presence of the analyte. In another example, block 608 measures an absolute current value and compares it to a predetermined expected value to determine whether the analyte is present.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 7:
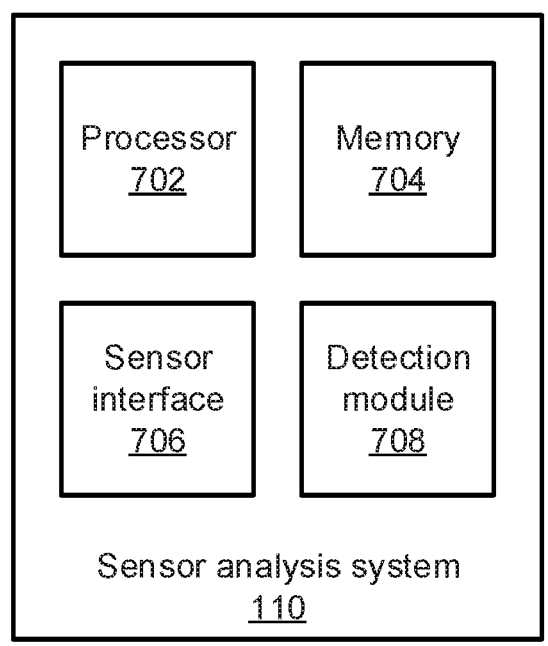
FIG. 7 is a block diagram of a sensor analysis system used to detect the presence of an analyte in accordance with an embodiment of the present invention.

Referring now to FIG. 7, additional detail on the sensor analysis system 110 is shown. The sensor analysis system 110 includes a hardware processor 702 and a memory 704. A sensor interface 706 collects current measurements from the sensor 108 and may include, for example, an ammeter. The sensor interface 706 stores sensor values in the memory 704. A detector module 708 is configured to detect changes in the sensor values by, e.g., comparison to values stored in the memory 704. The detector module 708 may then provide some indication of the detection of an analyte by, e.g., providing a visual or audio indication.

Figure 8:
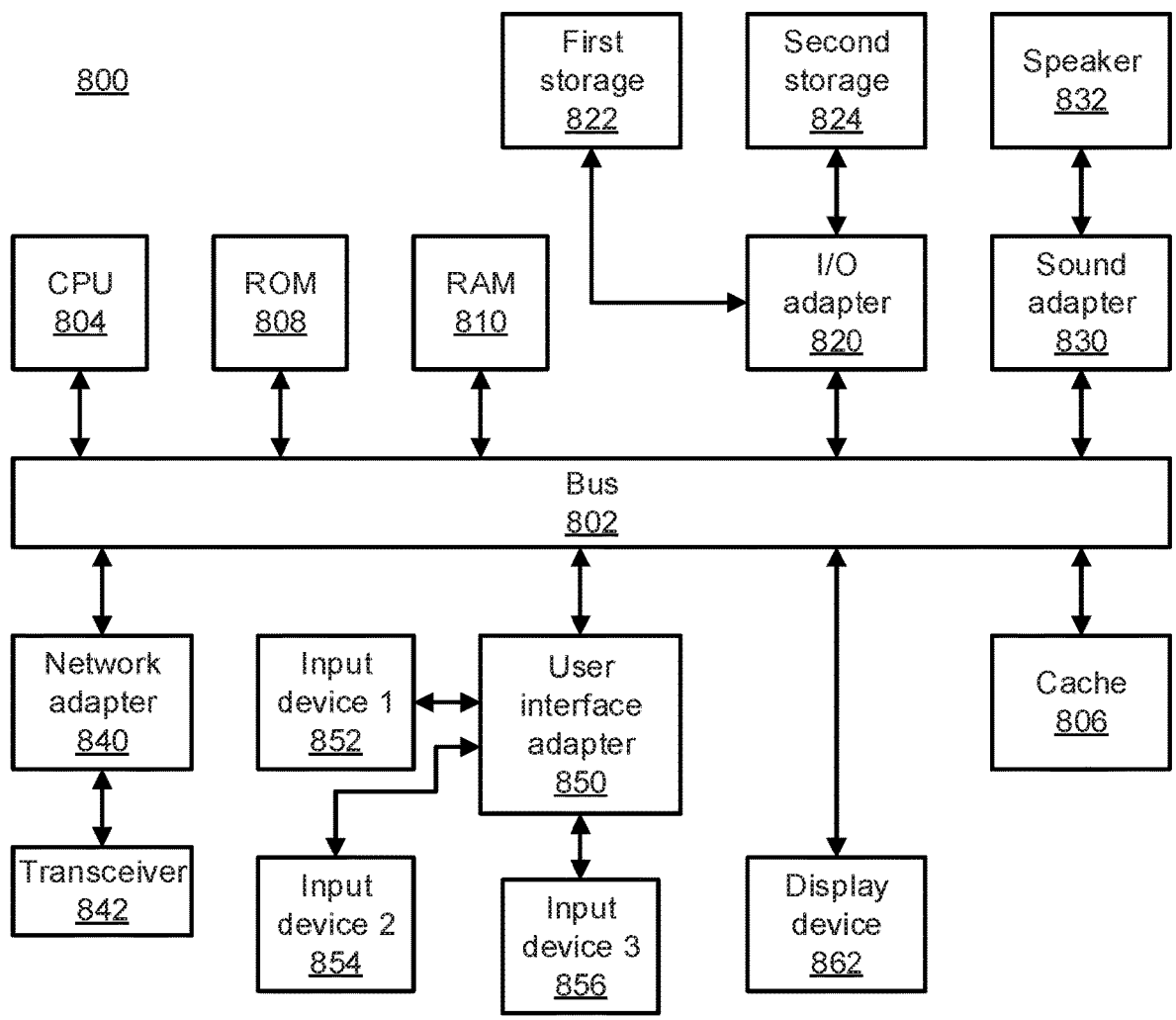
FIG. 8 is a block diagram of a processing system in accordance with an embodiment of the present invention.

Referring now to FIG. 8, an exemplary processing system 800 is shown which may represent the sensor analysis system 110. The processing system 800 includes at least one processor (CPU) 804 operatively coupled to other components via a system bus 802. A cache 806, a Read Only Memory (ROM) 808, a Random Access Memory (RAM) 810, an input/output (I/O) adapter 820, a sound adapter 830, a network adapter 840, a user interface adapter 850, and a display adapter 860, are operatively coupled to the system bus 802.

A first storage device 822 and a second storage device 824 are operatively coupled to system bus 802 by the I/O adapter 820. The storage devices 822 and 824 can be any of a disk storage device (e.g., a magnetic or optical disk storage device), a solid state magnetic device, and so forth. The storage devices 822 and 824 can be the same type of storage device or different types of storage devices.

A speaker 832 is operatively coupled to system bus 802 by the sound adapter 830. A transceiver 842 is operatively coupled to system bus 802 by network adapter 840. A display device 862 is operatively coupled to system bus 802 by display adapter 860.

A first user input device 852, a second user input device 854, and a third user input device 856 are operatively coupled to system bus 802 by user interface adapter 850. The user input devices 852, 854, and 856 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 852, 854, and 856 can be the same type of user input device or different types of user input devices. The user input devices 852, 854, and 856 are used to input and output information to and from system 800.

Of course, the processing system 800 may also include other elements (not shown), as readily contemplated by one of skill in the art, as well as omit certain elements. For example, various other input devices and/or output devices can be included in processing system 800, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 800 are readily contemplated by one of ordinary skill in the art given the teachings of the present principles provided herein.

Having described preferred embodiments of sensors based on negative capacitance FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A chemical sensor, comprising:
   a semiconductor substrate having an input terminal and an output terminal;
   a negative capacitance structure positioned on the semiconductor substrate, configured to control a current passing from the input terminal to the output terminal, comprising a first and second metal layer that are arranged vertically with respect to one another, and a ferroelectric layer positioned between the first and second metal layers; and
   a functionalized electrode in electrical contact with the negative capacitance structure, configured to change surface potential, in the presence of an analyte, to exceed a threshold, thereby triggering a discontinuous polarization change in the negative capacitance structure.

2. The chemical sensor of claim 1, wherein the ferroelectric layer is formed from a polyvinylidene fluoride.

3. The chemical sensor of claim 2, wherein the ferroelectric layer is formed from P(VDF0.75-TrFe0.25, PbZr0.52Ti0.48O3).

4. The chemical sensor of claim 1, wherein the input and output terminals are a source and drain region of a field-effect transistor and wherein the ferroelectric layer acts as a gate for the field-effect transistor.

5. The chemical sensor of claim 1, wherein the input and output terminals are a collector and drain of a bipolar junction transistor and wherein the ferroelectric layer acts as a base for the bipolar junction transistor.

6. The chemical sensor of claim 1, wherein the polarization change in the ferroelectric layer causes a change in the current passing from the input terminal to the output terminal.

7. A method for sensing the presence of an analyte, comprising:
   exposing a functionalized electrode to a substance to be tested, wherein the functionalized electrode is electrically connected to a sensor having a transistor comprising a negative capacitance structure, and wherein the negative capacitance structure includes a ferroelectric layer, positioned between two metal layers that are arranged vertically with respect to one another, and has a voltage threshold that triggers a discontinuous polarization change in the negative capacitance structure when the functionalized electrode exerts a potential in response to the presence of the analyte, and controls a current that passes between an input terminal and an output terminal of the transistor;
   measuring the current passing between the input terminal and the output terminal of the transistor; and
   determining the presence of the analyte based on changes in the measured current.

8. The method of claim 7, wherein determining the presence of the analyte comprises indicating the presence of the analyte if a change in the measured current exceeds a threshold.

9. The method of claim 7, wherein determining the presence of the analyte comprises comparing a voltage derived from the measured current to a voltage of a reference electrode.

10. A method of forming a chemical sensor, comprising:
   forming an input terminal and an output terminal on a semiconductor substrate;
   forming a negative capacitance structure over the semiconductor substrate, the input terminal, and the output terminal, the negative capacitance structure having a threshold voltage that triggers a discontinuous polarization change in the negative capacitance structure, by:
  forming a first metal layer;
  forming a ferroelectric layer on the first metal layer; and
  forming a second metal layer on the ferroelectric layer; and
forming a functionalized electrode, in electrical communication with the negative capacitance structure, that exerts an above-threshold voltage on the negative capacitance structure in the presence of an analyte.

11. The method of claim 10, wherein forming the functionalized electrode comprises treating a top surface of the second metal layer with a functionalizing substance.

12. The method of claim 10, wherein the ferroelectric layer is formed from polyvinylidene fluoride.

13. The method of claim 12, wherein the ferroelectric layer is formed from P(VDF0.75-TrFe0.25, PbZr0.52Ti0.48O3).

14. The method of claim 10, wherein forming the functionalized electrode comprises treating a separate metal electrode with a functionalizing substance and connecting the separate metal electrode to the negative capacitance structure with a conductive element.

15. The method of claim 10, further comprising forming a reference electrode that exhibits a fixed voltage.

* * * * *